(12) United States Patent
Farooq et al.

(10) Patent No.: US 9,055,703 B2
(45) Date of Patent: Jun. 9, 2015

(54) SIDEWALLS OF ELECTROPLATED COPPER INTERCONNECTS

(71) Applicant: International Business Machines Corporation, Armonk, NY (US)

(72) Inventors: Mukta G. Farooq, Hopewell Junction, NY (US); John A. Fitzsimmons, Poughkeepsie, NY (US); Troy L. Graves-Abe, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/043,127

(22) Filed: Oct. 1, 2013

(65) Prior Publication Data

US 2014/0027912 A1 Jan. 30, 2014

Related U.S. Application Data

(62) Division of application No. 13/525,823, filed on Jun. 18, 2012, now Pat. No. 8,791,005.

(51) Int. Cl.
*H05K 3/42* (2006.01)
*H01L 23/48* (2006.01)
(Continued)

(52) U.S. Cl.
CPC ......... *H05K 3/423* (2013.01); *Y10T 428/12764* (2015.01); *H01L 23/481* (2013.01);
(Continued)

(58) Field of Classification Search
CPC ............... H01L 21/76843; H01L 21/76849; H01L 21/76867; H01L 23/53238; H01L 21/76883; H01L 21/76886; H01L 21/76873
USPC ........................... 257/761, 737, 781; 438/692
See application file for complete search history.

(56) References Cited

U.S. PATENT DOCUMENTS

| | | | |
|---|---|---|---|
| 6,793,796 B2 | 9/2004 | Reid et al. |
| 6,946,065 B1 | 9/2005 | Mayer et al. |
| 7,220,674 B2 | 5/2007 | Marieb et al. |
| 7,815,786 B2 | 10/2010 | Paneccasio, Jr. et al. |
| 7,968,455 B2 | 6/2011 | Lin et al. |
| 7,988,843 B2 | 8/2011 | Chang et al. |
| 8,048,280 B2 | 11/2011 | Mayer et al. |

(Continued)

FOREIGN PATENT DOCUMENTS

EP 1465246 10/2004

OTHER PUBLICATIONS

Zhang et al., "Microstructural and Compositional Failure Analysis of CR—CRCU—CU Thin Films for Ball Grid Array (BGA) Applications", Proceedings of 6th IPFA, 1997, Singapore, 1997 IEEE, pp. 44-49.

*Primary Examiner* — Kenneth Parker
*Assistant Examiner* — Bo Fan
(74) *Attorney, Agent, or Firm* — Steven Meyers; L. Jeffrey Kelly

(57) ABSTRACT

A structure including a seed layer located directly on top of and conformal to the diffusion barrier, wherein the seed layer is parallel to the sidewall and bottom of the opening, the seed layer comprises a crystalline structure suitable for plating copper; a first intermetallic compound and an alloy layer parallel to the sidewall of the opening and separating the seed layer from the conductive material, the first intermetallic compound is a precipitate within a solid solution of an alloying material of the alloy layer and the conductive material, and is molecularly bound to both the alloy layer and the conductive material, and a first high friction interface located between the seed layer and the alloy layer extending in a direction parallel to the sidewall of the opening, wherein the first high friction interface results in a mechanical bond between the seed layer and the alloy layer.

14 Claims, 11 Drawing Sheets

(51) Int. Cl.
*H01L 23/532* (2006.01)
*H01L 21/768* (2006.01)

(52) U.S. Cl.
CPC .... *H01L23/53238* (2013.01); *H01L 23/53209* (2013.01); *H01L 23/53214* (2013.01); *H01L 23/53242* (2013.01); *H01L 23/53257* (2013.01); *H01L 21/76898* (2013.01); *H01L 21/76844* (2013.01); *H01L 21/76846* (2013.01); *H01L 21/76858* (2013.01); *H01L 2924/0002* (2013.01)

(56) References Cited

U.S. PATENT DOCUMENTS

| | | | |
|---|---|---|---|
| 8,791,005 | B2 | 7/2014 | Farooq et al. |
| 2006/0011483 | A1 | 1/2006 | Mayer et al. |
| 2010/0015805 | A1* | 1/2010 | Mayer et al. ............ 438/692 |
| 2010/0059893 | A1* | 3/2010 | Chang et al. ............ 257/761 |
| 2011/0163062 | A1 | 7/2011 | Gordon et al. |
| 2011/0240481 | A1 | 10/2011 | Keigler et al. |
| 2014/0027296 | A1 | 1/2014 | Farooq et al. |
| 2014/0027912 | A1 | 1/2014 | Farooq et al. |

* cited by examiner

SIDEWALLS OF ELECTROPLATED COPPER INTERCONNECTS

BACKGROUND

1. Field of the Invention

The present invention generally relates to integrated circuits, and more particularly to electroplating copper interconnects.

2. Background of Invention

Advancements in the area of semiconductor fabrication have enabled the manufacturing of integrated circuits that have a high density of electronic components. The length and number of interconnect wiring increases in high density integrated circuits. Three-dimensional (3D) stacking of integrated circuits has been created to address these challenges. Fabrication of 3D integrated circuits includes at least two silicon chips stacked vertically. Vertically stacked chips can reduce interconnect wiring length and increase device density. Deep through-substrate vias (TSVs) can provide interconnections and electrical connectivity between the electronic components of the vertically stacked chips. Such vias may require high aspect ratios, where the via height is large with respect to the via width, to save valuable area on the silicon substrate. TSVs enable increased device density while reducing the total length of interconnect wiring.

However, fabrication techniques such as chemical vapor deposition (CVD) are unable to fill high aspect ratio TSVs without the risk of pinch-off. Pinch-off refers to build up of deposited material at an opening of a trench or a via hole (e.g., TSV). Pinch-off can result in the formation of voids, where some volume of a trench or a via hole (e.g., TSV) remain unfilled with the deposited material. Void formation can reduce the conductive cross section and if large enough may constitute a short and sever the interconnect structure. Thus, void formation can reduce integrated circuit performance, decrease reliability of interconnects, cause sudden data loss, and reduce the useful life of semiconductor integrated circuit products. In addition, pinch-off can result in undesired process chemicals to be trapped within a trench or a via hole (e.g., TSV).

An alternative technique for filling TSVs with conductive material may include electroplating. Electroplating techniques require a cathode. IF the part to be plated is conductive, it can serve as the cathode. The cathode can be connected to a negative terminal of an external power supply and thus must be electrically conductive. A seed layer can be deposited to serve as the cathode. For example, a copper film may be deposited using physical vapor deposition or other known deposition techniques to form the requisite cathode, or seed layer, in preparation for electroplating. When electroplating a trench or via hole an electrical potential is applied to the cathode while the structure is exposed to an electrolyte solution where the desired plating material can plate out onto the cathode. However, in high aspect ratio features, the risk of pinch-off remains because the deposition on sidewalls and bottom can proceed roughly at the same rate, so the feature closes from the sides before fully filling from the bottom (this tendency is exacerbated by mass transfer limitations at the remote end of a deep feature).

Accordingly, current fabrication techniques for filling high aspect ratio TSVs with a conductive material show risks and disadvantages. Despite achievements that have been made in 3D integrated circuit technology, to increase device density and reduce the length of interconnection wiring, the challenge of fabricating and filling high aspect ratio TSVs without void formation and chemical entrapment continues to persist.

SUMMARY

According one embodiment of the present invention, a structure formed in an opening, the opening having a substantially vertical sidewall defined by a non-metallic material and having a substantially horizontal bottom defined by a conductive pad, the structure comprising a diffusion barrier covering the sidewall and a fill composed of conductive material: is provided. The structure may include a first intermetallic compound separating the diffusion barrier from the conductive material, wherein the first intermetallic compound comprises an alloying material and the conductive material, and is mechanically bound to the conductive material, wherein the alloying material is at least one of the materials selected from the group consisting of chromium, tin, nickel, magnesium, cobalt, aluminum, manganese, titanium, zirconium, indium, palladium, and silver; and a first high friction interface located between the diffusion barrier and the first intermetallic compound and parallel to the sidewall of the opening, wherein the first high friction interface results in a mechanical bond between the diffusion barrier and the first intermetallic compound.

According another exemplary embodiment, structure formed in an opening, the opening having a substantially vertical sidewall defined by a non-metallic material and having a substantially horizontal bottom defined by the non-metallic material, the structure comprising a diffusion barrier covering the sidewall and bottom, and a fill composed of conductive material is provided. The structure may include a seed layer located directly on top of and conformal to the diffusion barrier, wherein the seed layer is parallel to the sidewall and bottom of the opening; a first intermetallic compound separating the seed layer and the conductive material and parallel to the sidewall of the opening, wherein the first intermetallic compound comprises an alloying material and the conductive material, and is mechanically bound to the conductive material, wherein the alloying material is at least one of the materials selected from the group consisting of chromium, tin, nickel, magnesium, cobalt, aluminum, manganese, titanium, zirconium, indium, palladium, and silver; and a first high friction interface located between the seed layer and the first intermetallic compound and parallel to the sidewall of the opening, wherein the first high friction interface results in a mechanical bond between the seed layer and the first intermetallic compound.

According another exemplary embodiment, a method of plating a structure comprising an opening etched in a nonmetallic material, a diffusion barrier deposited along a sidewall of the opening, and a conductive pad located at a bottom of the opening is provided. The method may include depositing an alloying material on top of the diffusion barrier, wherein the alloying material comprises an incorrect crystalline structure to serve as a seed for plating the conductive material, exposing the opening to an electroplating solution comprising the conductive material, and applying an electrical potential to the conductive pad causing the conductive material to deposit from the electroplating solution onto the conductive pad and causing the opening to fill with the conductive material. The method may further include forming a first intermetallic compound along an intersection of the alloying material and the conductive material, the first intermetallic compound comprising the alloying material and the conductive material, According another exemplary embodiment, a method of plating a structure comprising an opening etched in a nonmetallic material and a diffusion barrier deposited along a sidewall and along a bottom of the opening is provided. The method may include depositing a seed layer along the sidewall and the bottom of the opening, wherein the seed layer comprises a correct crystalline structure to seed copper, depositing an alloying material on top of the diffusion barrier and parallel to the sidewall of the opening, wherein the alloying material comprises an incorrect crystalline structure to serve as a seed for plating the conductive material, and exposing the opening to an electroplating solution comprising the conductive material. The method may further include applying an electrical potential to the seed layer causing the conductive material to deposit from the electroplating solution onto the seed layer exposed at the bottom of the opening and causing the opening to fill with the conductive material, and forming a first intermetallic compound along an intersection between the alloying material and the conductive material, the first intermetallic compound comprising the alloying material and the conductive material.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which:

FIG. 1A illustrates a step in the formation of a copper interconnect structure according to one embodiment.

FIG. 1B illustrates a step in the formation of a copper interconnect structure according to one embodiment.

FIG. 1C illustrates a step in the formation of a copper interconnect structure according to one embodiment.

FIG. 1D illustrates a step in the formation of a copper interconnect structure according to one embodiment.

FIG. 7A illustrates a step in the formation of a copper interconnect structure according to one embodiment.

FIG. 7B illustrates a step in the formation of a copper interconnect structure according to one embodiment.

FIG. 7C illustrates a step in the formation of a copper interconnect structure according to one embodiment.

FIG. 7D illustrates a step in the formation of a copper interconnect structure according to one embodiment.

FIG. 7E illustrates a step in the formation of a copper interconnect structure according to one embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
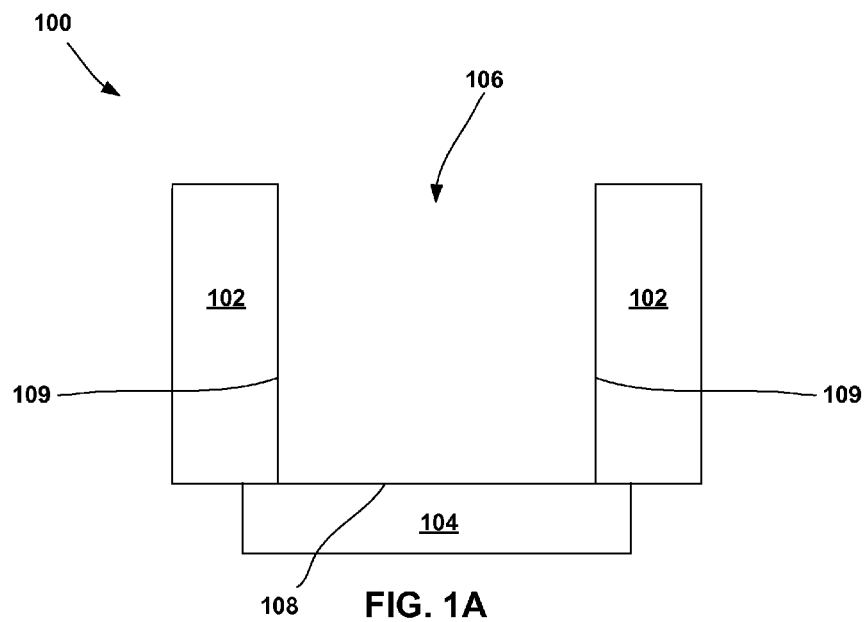
FIGS. 1A-1D illustrate the steps of a method of forming a copper interconnect structure according to one embodiment.

Detailed embodiments of the claimed structures and methods are disclosed herein; however, it is understood that the disclosed embodiments are merely illustrative of the claimed structures and methods that may be embodied in various forms. This disclosure may, however, be embodied in many different forms and should not be construed as limited to the exemplary embodiment set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Referring to FIGS. 1A-1D, multiple steps of a method of forming an interconnect structure are shown. Now referring to FIG. 1A, a cross-sectional view of an interconnect structure 100 having an opening 106 in a nonmetallic material 102 and a conductive pad 104 positioned at a bottom 108 of the opening 106 is shown. The interconnect structure 100 may include lines, wires, vias or through-substrate vias (TSVs). In one embodiment, the nonmetallic material 102 may be made from any of several known semiconductor materials such as, for example, silicon (e.g. a bulk silicon substrate), germanium, silicon-germanium alloy, silicon carbide, silicon-germanium carbide alloy, and compound (e.g. III-V and II-VI) semiconductor materials. In one embodiment, the nonmetallic material 102 may be made from any dielectric material know to a person having ordinary skill in the art. The conductive pad 104 itself may include a line, a wire or a via. Alternatively, the interconnect structure 100 may include a trench formed in the nonmetallic material 102 without the conductive pad 104, as described below (see FIGS. 7A-7E, 8-12). An optional electrically insulating liner 110 (not shown) may be deposited along a sidewall 109 of the opening 106 and on top of the nonmetallic material 102.

Figure 1B:
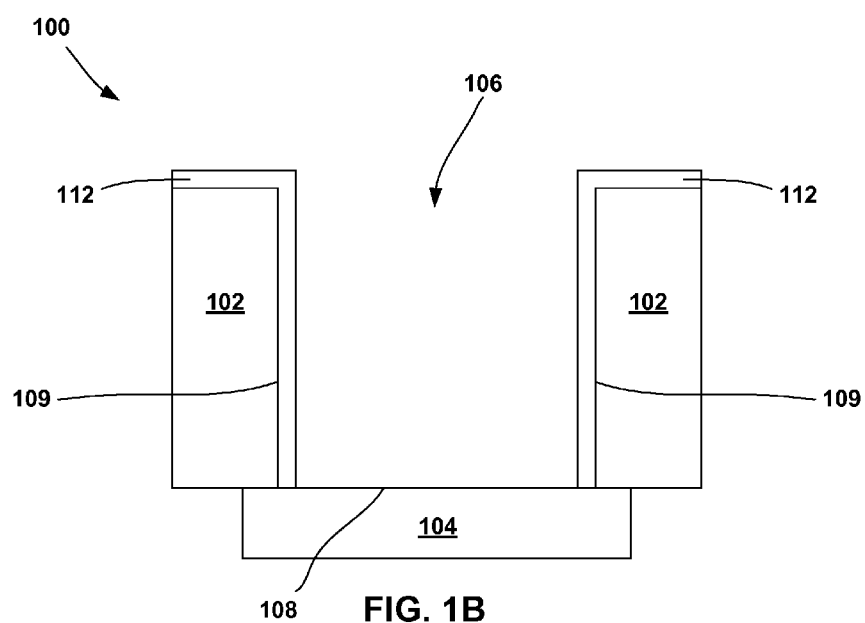

Now referring to FIG. 1B, a diffusion barrier 112 may be deposited along the sidewall 109 of the opening 106 and on top of the nonmetallic material 102. The diffusion barrier 112 may be deposited only on the nonmetallic material 102 and not on the conductive pad 104. The diffusion barrier 112 may include any material that which prohibits contamination of a copper material by the nonmetallic material 102. In one embodiment, the diffusion barrier 112 may be made from a material including tantalum nitride deposited by physical vapor deposition (PVD). In one embodiment, the diffusion barrier 112 may be deposited by an alternative deposition technique, for example chemical vapor deposition (CVD) or atomic layer deposition (ALD).

Figure 1C:
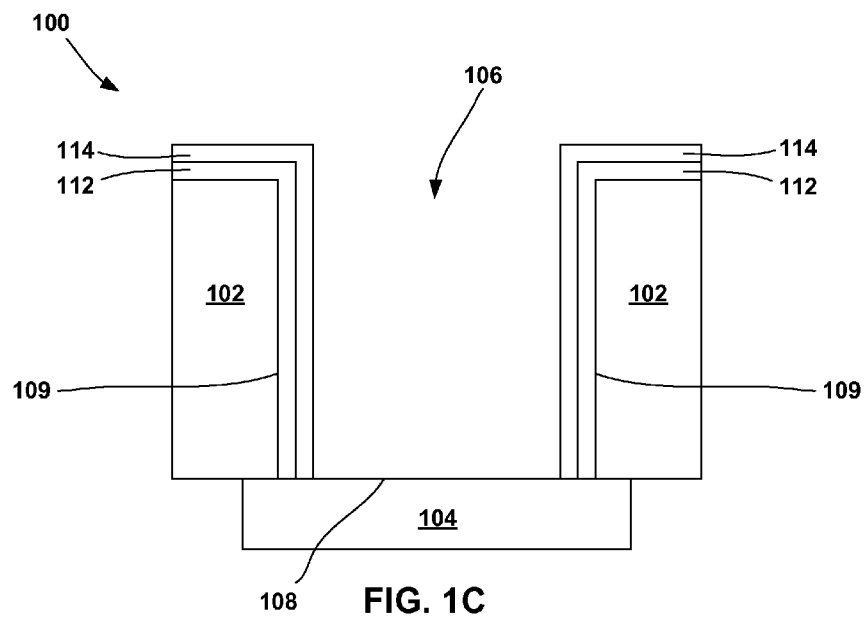

Now referring to FIG. 1C, an alloying material 114 may be deposited on top of the diffusion barrier 112. In one embodiment, the alloying material 114 may be deposited only on the diffusion barrier 112 and not on the conductive pad 104. In one embodiment, the alloying material 114 may be made from a material including chromium deposited in a vacuum using a sputter deposition technique. In one embodiment, the alloying material 114 may be made from a material including chromium, copper, nickel, tin, magnesium, cobalt, aluminum, manganese, titanium, zirconium, indium, palladium, gold, or some combination thereof. The alloying material 114 may not have the correct crystalline structure to serve as a seed for copper plating. In other words, the crystal face orientation of the alloying material 114 may not mimic the crystal face orientation of copper; such that the surface of the alloying material 114 will not allow copper to grow from the its face. For example, Cr has a BCC (Body Centered Cubic) lattice whereas Cu has an FCC (Face Centered Cubic) lattice. These two lattice structures are inherently incompatible, i.e. Cr cannot act as a seed for Cu plating.

Figure 13:
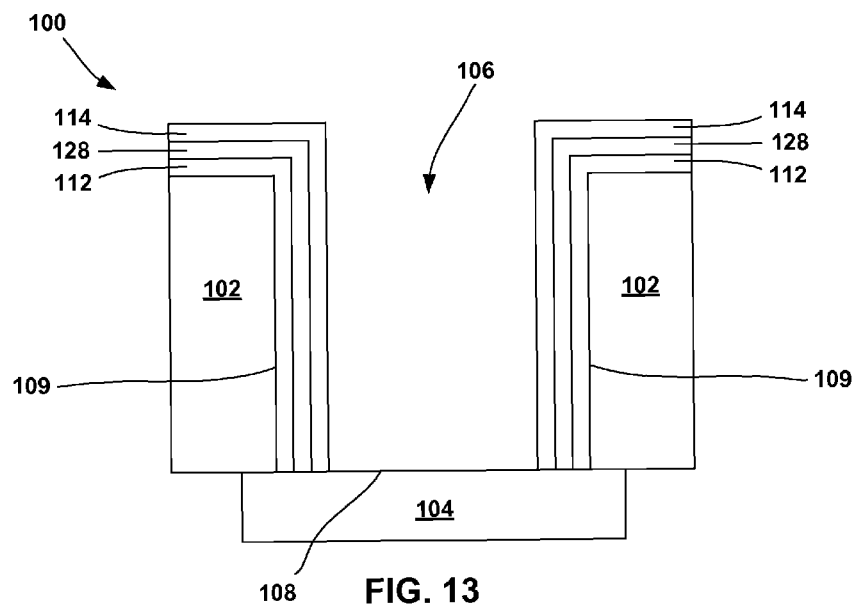
FIG. 13 illustrates a copper interconnect structure according to one embodiment.

In one embodiment, an optional adhesive liner 128 such as gold (see FIG. 13) may be used prior to depositing the alloying material 114. The alloying material 114 may have a thickness ranging from about 50 angstroms to about 300 angstroms.

In one embodiment, the diffusion barrier 112 and the alloying material 114 may be deposited on the sidewall 109 and the bottom 108 of the opening 106. In such embodiments, the diffusion barrier 112 and the alloying material 114 may be subsequently removed from the bottom 108 of the opening 106. For example, an anisotropic etch may be used to remove the diffusion barrier 112 and the alloying material 114 from the bottom 108 to expose the conductive pad 104 without removing the diffusion barrier 112 and the alloying material 114 from the sidewall 109 of the opening 106. This anisotropic etch may be performed after all layers are deposited or immediately following the deposition of each layer.

Figure 1D:
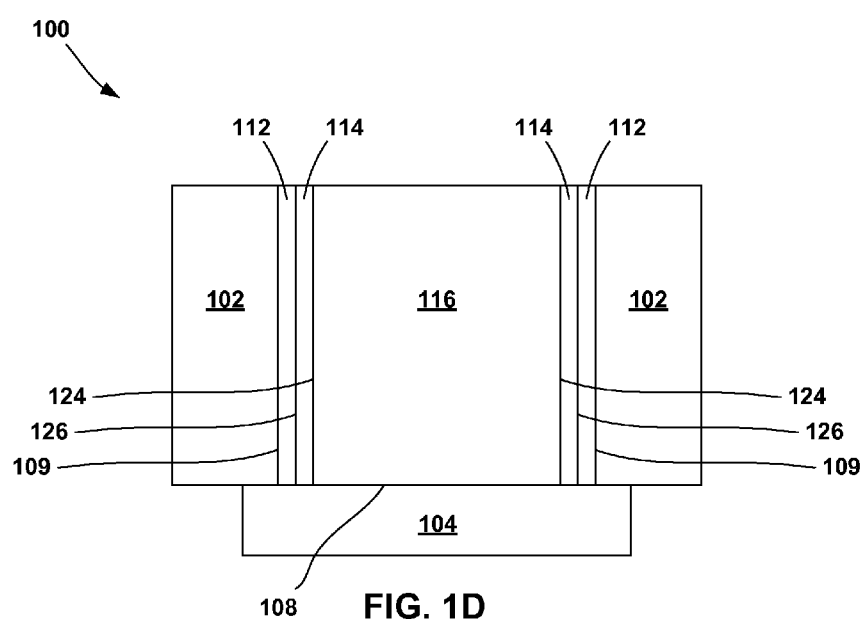

Now referring to FIG. 1D, a copper material 116 may be deposited on the conductive pad 104 within the opening 106 (shown in FIG. 1C) using an electroplating technique. The conductive pad 104 may serve as a cathode to which an electrical potential is applied during the electroplating technique. Specifically, a negative voltage may be applied to the conductive pad 104. The conductive pad 104 may also serve as a copper seed. Because the specific alloying material 114 chosen may not have the correct crystalline structure to serve as a seed for copper plating, a bottom-up plating technique, free of voiding or pinch-off, may therefore be achieved. The bottom-up plating technique results in filling the opening 106 (shown in FIG. 1C) with the copper material 116. After the electroplating technique a chemical mechanical polishing (CMP) technique may be used to remove excess copper from the surface of the substrate. The CMP technique can remove the diffusion barrier 112, the alloying material 114, and excess copper material 116 selective to the top surface of the nonmetallic material 102.

The alloying material 114 may be used to form a mechanical bond between the copper material 116 and the sidewall 109 of the opening 106. The mechanical bond can be created either by forming an intermetallic compound or by creating a high friction interface caused by an extremely close contact between layers. Extremely close contact may be defined as maximizing interfacial surface contact while minimizing foreign contaminants between two layers. The mechanical bond may be created at an intersection 124 or an intersection 126. Lack of a mechanical bond between the copper material 116 and the sidewall 109 of the opening 106 may result in a pistoning effect where the copper material 116 moves vertically within the opening 106 during thermal cycling due to copper's relatively high coefficient of thermal expansion in comparison to surrounding semiconductor materials (e.g. silicon, silicon oxides, and silicon nitrides). Thermal expansion and contraction is inevitable when building or operating integrated circuits. Pistoning of the copper material 116 may impose stress and strain on corresponding components that may be connected to the copper material 116 and over time will cause a failure in these connections.

Referring to FIGS. 2-6, multiple different embodiments of the interconnect structure 100 are shown. Now referring to FIG. 2, one embodiment of the interconnect structure 100 is shown. A first interaction may occur between the alloying material 114 (shown in FIG. 1D) and the copper material 116 at the intersection 124 (shown in FIG. 1D). The first interaction may produce a first intermetallic compound 118 formed from the alloying material 114 (shown in FIG. 1D) and the copper material 116 at the intersection 124 (shown in FIG. 1D). The first intermetallic compound 118 may include the alloying material 114 (shown in FIG. 1D) and the copper material 116. The first intermetallic compound 118 can form a mechanical bond between the alloying material 114 (shown in FIG. 1D) and the copper material 116. The first intermetallic compound 118 may be formed either simultaneously while plating the copper material 116 or any time thereafter, for example during a subsequent annealing process.

Formation of the intermetallic compound 118 between the alloying material 114 (shown in FIG. 1D) and the copper material 116 may occur when favorable thermodynamic and kinetic conditions exist for the compounds to form as a precipitate within a solid solution of the two materials, in this case the alloying material 114 (shown in FIG. 1D) and the copper material 116. Intermetallic compounds may be stoichiometric or non-stoichiometric. For example, $Ag_3Sn$ is an intermetallic compound that may form when Ag and Sn are in a solid solution.

A second interaction may occur between the diffusion barrier 112 and the alloying material 114 (shown in FIG. 1D) at the intersection 126 (shown in FIG. 1D). The second interaction may involve extremely close contact between the diffusion barrier 112 and the alloying material 114 (shown in FIG. 1D) at the intersection 126 (shown in FIG. 1D). Extremely close contact may create an area of high friction which may result in a mechanical bond between the diffusion barrier 112 and the alloying material 114 (shown in FIG. 1D). In one embodiment, extremely close contact may be achieved by depositing one material on top of another material in a vacuum using a sputter deposition technique. If one material is deposited on another material with either vacuum interruption or via an aqueous system, the possibility for extremely close contact is significantly diminished by native oxides or third body interference films, e.g. water may be present between the interfaces. The alloying material 114 (shown in FIG. 1D) may be deposited on top of the diffusion barrier 112 in a vacuum using the sputter deposition technique, and resulting in extremely close contact.

Figure 2:
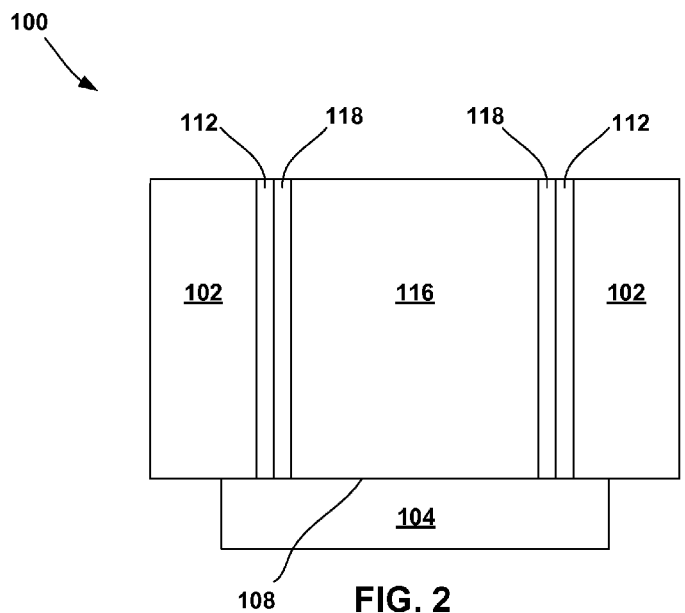
FIG. 2 illustrates a copper interconnect structure according to one embodiment.

With continued reference to FIG. 2, the diffusion barrier 112 may be deposited with uniform, or near uniform, thickness. The first intermetallic compound 118 may have a non-uniform thickness and can mechanically join the alloying material 114 (shown in FIG. 1D) with the copper material 116. Formation of the first intermetallic compound 118 may consume all or some of the alloying material 114 (shown in FIG. 1D). In one embodiment, the alloying material 114 (shown in FIG. 1D) is entirely consumed by the formation of the first intermetallic compound 118, as shown in FIG. 2. The mechanical bond created by the first intermetallic compound 118 and extremely close contact between the diffusion barrier 112 and the alloying material 114 (shown in FIG. 1D) can minimize the pistoning effect described above. The integrity of chip interconnects can be greatly improved by minimizing the pistoning effect because of the reduced risk of interconnect failure due to thermal expansion and contraction.

Figure 3:
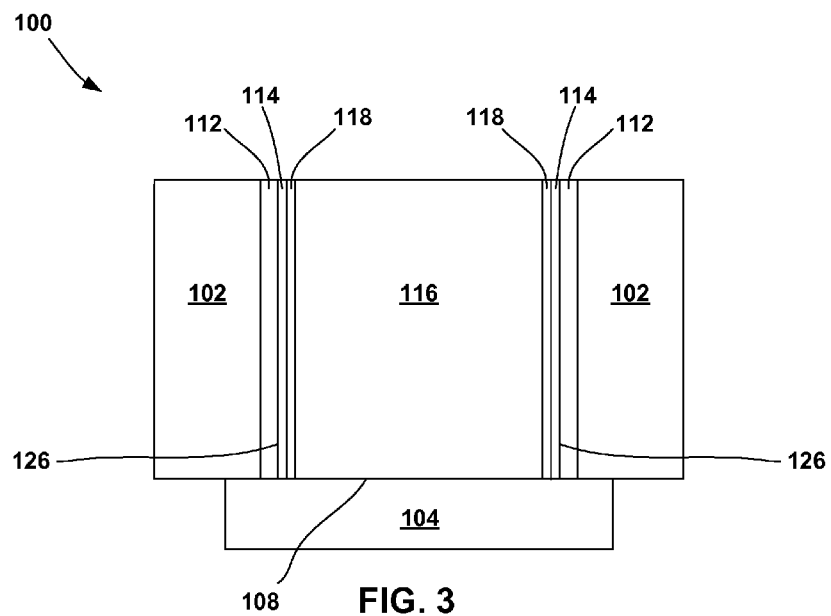
FIG. 3 illustrates a copper interconnect structure according to one embodiment.

Now referring to FIG. 3, one embodiment of the interconnect structure 100 is shown. A first interaction may occur between the alloying material 114 and the copper material 116 at the intersection 124 (shown in FIG. 1D). The first interaction may produce the first intermetallic compound 118 formed from the alloying material 114 and the copper material 116 at the intersection 124 (shown in FIG. 1D). The first intermetallic compound 118 may include the alloying material 114 and the copper material 116. The first intermetallic compound 118 can form a mechanical bond between the alloying material 114 and the copper material 116. The first intermetallic compound 118 may be formed either simultaneously while plating the copper material 116 or any time thereafter, for example during a subsequent annealing process.

A second interaction may occur between the diffusion barrier 112 and the alloying material 114 at the intersection 126. The second interaction may involve extremely close contact between the diffusion barrier 112 and the alloying material 114 at the intersection 126. Extremely close contact may create an area of high friction which may result in a mechanical bond between the diffusion barrier 112 and the alloying material 114.

With continued reference to FIG. 3, the diffusion barrier 112 may be deposited with uniform, or near uniform, thickness. The first intermetallic compound 118 may have a non-uniform thickness and can mechanically join the alloying material 114 with the copper material 116. Formation of the first intermetallic compound 118 may consume all or some of the alloying material 114. In one embodiment, the alloying material 114 is not entirely consumed by the formation of the first intermetallic compound 118 such that some of the alloying material 114 remains between the first intermetallic compound 118 and the diffusion barrier 112, as shown in FIG. 3. The mechanical bond created by the first intermetallic compound 118 and extremely close contact between the diffusion barrier 112 and the alloying material 114 can minimize the pistoning effect described above. The integrity of chip interconnects can be greatly improved by minimizing the pistoning effect because of the reduced risk of interconnect failure due to thermal expansion and contraction.

Figure 4:
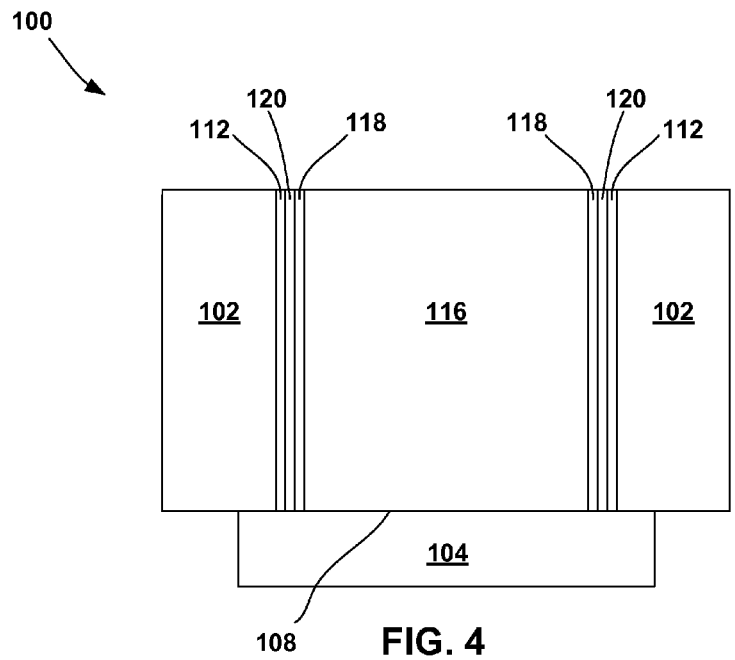
FIG. 4 illustrates a copper interconnect structure according to one embodiment.

Now referring to FIG. 4, one embodiment of the interconnect structure 100 is shown. A first interaction may occur between the alloying material 114 (shown in FIG. 1D) and the copper material 116 at the intersection 124 (shown in FIG. 1D). The first interaction may produce the first intermetallic compound 118 formed from the alloying material 114 (shown in FIG. 1D) and the copper material 116 at the intersection 124 (shown in FIG. 1D). The first intermetallic compound 118 may include the alloying material 114 (shown in FIG. 1D) and the copper material 116. The first intermetallic compound 118 can form a mechanical bond between the alloying material 114 (shown in FIG. 1D) and the copper material 116. The first intermetallic compound 118 may be formed either simultaneously while plating the copper material 116 or any time thereafter, for example during a subsequent annealing process.

A second interaction may occur between the diffusion barrier 112 and the alloying material 114 (shown in FIG. 1D) at the intersection 126 (shown in FIG. 1D). The second interaction may produce a second intermetallic compound 120 formed from the diffusion barrier 112 and the alloying material 114 (shown in FIG. 1D) at the intersection 126 (shown in FIG. 1D). The second intermetallic compound 120 may include the diffusion barrier 112 and the alloying material 114 (shown in FIG. 1D). The second intermetallic compound 120 can form a mechanical bond between the diffusion barrier 112 and the alloying material 114 (shown in FIG. 1D). The second intermetallic compound 120 may be formed either simultaneously while depositing the alloying material 114 (shown in FIG. 1D) or any time thereafter, for example during a subsequent annealing process.

With continued reference to FIG. 4, the diffusion barrier 112 may be deposited with uniform, or near uniform, thickness. The first intermetallic compound 118 may have a non-uniform thickness and can mechanically join the alloying material 114 (shown in FIG. 1D) with the copper material 116. The second intermetallic compound 120 may have a non-uniform thickness and can mechanically join the diffusion barrier 112 with the alloying material 114 (shown in FIG. 1D). Formation of the intermetallic compounds 118, 120 may consume all or some of the alloying material 114 (shown in FIG. 1D). In one embodiment, the alloying material 114 (shown in FIG. 1D) is entirely consumed by the formation of the intermetallic compounds 118, 120, as shown in FIG. 4. The mechanical bond created by the intermetallic compounds 118, 120 can minimize the pistoning effect described above. The integrity of chip interconnects can be greatly improved by minimizing the pistoning effect because of the reduced risk of interconnect failure due to thermal expansion and contraction.

Figure 5:
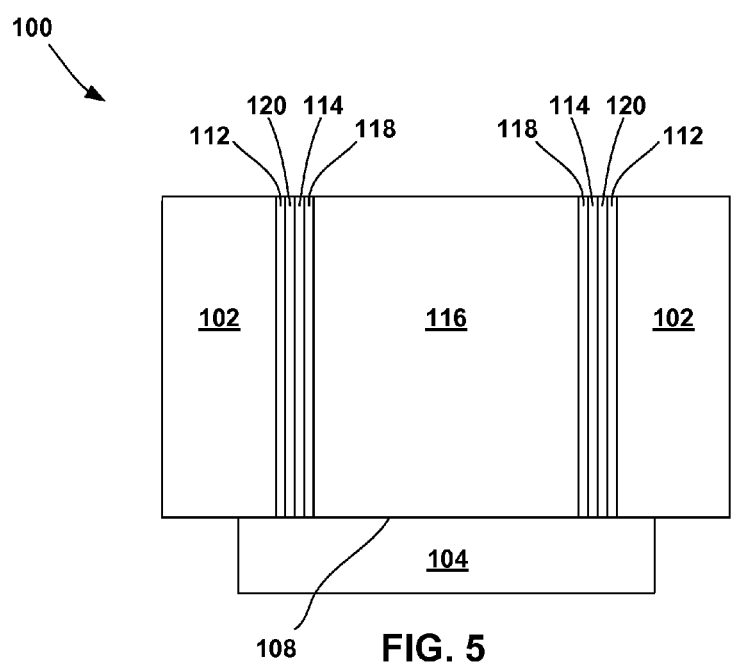
FIG. 5 illustrates a copper interconnect structure according to one embodiment.

Now referring to FIG. 5, one embodiment of the interconnect structure 100 is shown. A first interaction may occur between the alloying material 114 and the copper material 116 at the intersection 124 (shown in FIG. 1D). The first interaction may produce the first intermetallic compound 118 formed from the alloying material 114 and the copper material 116 at the intersection 124 (shown in FIG. 1D). The first intermetallic compound 118 may include the alloying material 114 and the copper material 116. The first intermetallic compound 118 can form a mechanical bond between the alloying material 114 and the copper material 116. The first intermetallic compound 118 may be formed either simultaneously while plating the copper material 116 or any time thereafter, for example during a subsequent annealing process.

A second interaction may occur between the diffusion barrier 112 and the alloying material 114 at the intersection 126 (shown in FIG. 1D). The second interaction may produce the second intermetallic compound 120 formed from the diffusion barrier 112 and the alloying material 114 at the intersection 126 (shown in FIG. 1D). The second intermetallic compound 120 may include the diffusion barrier 112 and the alloying material 114. The second intermetallic compound 120 can form a mechanical bond between the diffusion barrier 112 and the alloying material 114. The second intermetallic compound 120 may be formed either simultaneously while depositing the alloying material 114 or any time thereafter, for example during a subsequent annealing process.

With continued reference to FIG. 5, the diffusion barrier 112 may be deposited with uniform, or near uniform, thickness. The first intermetallic compound 118 may have a non-uniform thickness and can mechanically join the alloying material 114 with the copper material 116. The second intermetallic compound 120 may have a non-uniform thickness and can mechanically join the diffusion barrier 112 with the alloying material 114. Formation of the intermetallic compounds 118, 120 may consume all or some of the alloying material 114. In one embodiment, the alloying material 114 is not entirely consumed by the formation of the intermetallic compounds 118, 120 such that some of the alloying material 114 remains between the first intermetallic compound 118 and the second intermetallic compound 120, as shown in FIG. 5. The mechanical bond created by the intermetallic compounds 118, 120 can minimize the pistoning effect described above. The integrity of chip interconnects can be greatly improved by minimizing the pistoning effect because of the reduced risk of interconnect failure due to thermal expansion and contraction.

Figure 6:
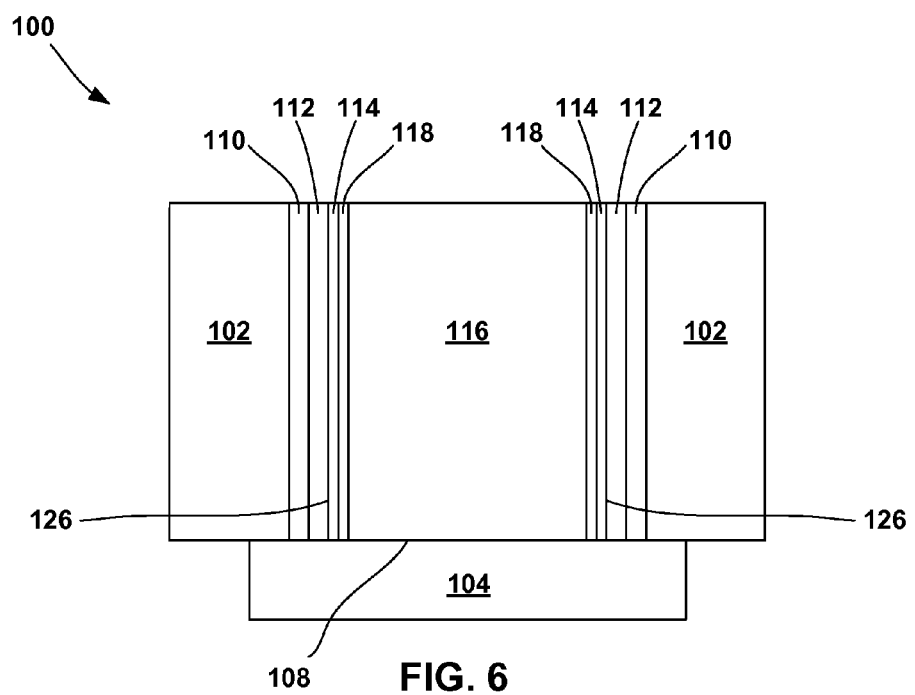
FIG. 6 illustrates a copper interconnect structure according to one embodiment.

Now referring to FIG. 6, one embodiment of the interconnect structure 100 is shown. A first interaction may occur between the alloying material 114 and the copper material 116 at the intersection 124 (shown in FIG. 1D). The first interaction may produce the first intermetallic compound 118 formed from the alloying material 114 and the copper material 116 at the intersection 124 (shown in FIG. 1D). The first intermetallic compound 118 may include the alloying material 114 and the copper material 116. The first intermetallic compound 118 can form a mechanical bond between the alloying material 114 and the copper material 116. The first intermetallic compound 118 may be formed either simultaneously while plating the copper material 116 or any time thereafter, for example during a subsequent annealing process.

A second interaction may occur between the diffusion barrier 112 and the alloying material 114 at the intersection 126. The second interaction may involve extremely close contact between the diffusion barrier 112 and the alloying material 114 at the intersection 126. Extremely close contact may create an area of high friction which may result in a mechanical bond between the diffusion barrier 112 and the alloying material 114.

The optional electrically insulating liner 110 may be deposited on top of the nonmetallic material 102 and not on the conductive pad 104 prior to depositing the diffusion barrier 112. In one embodiment, the electrically insulating liner 110 may be deposited on the sidewall 109 and the bottom 108 of the opening 106. In such embodiments the electrically insulating liner 110, along with the diffusion barrier 112 and the alloying material 114, may be subsequently removed from the bottom 108 of the opening 106. For example, an anisotropic etch may be used to remove the electrically insulating liner 110, the diffusion barrier 112, and the alloying material 114 from the bottom 108 to expose the conductive pad 104 without removing material from the sidewall of the opening 106. Alternatively, the anisotropic etch may be performed to remove each of the deposited layers from the bottom 108 of the opening 106 immediately following their deposition.

The electrically insulating liner 110 may include any material that which prohibits the conduction of electricity between a copper material and a semi-conductive nonmetallic material. Therefore, if the nonmetallic material 102 is itself electrically insulating, the electrically insulating liner 110 may not be used. The electrically insulating liner 110 may be made from an oxide, nitride, or insulating polymer. Deposition techniques such as, for example, chemical vapor deposition (CVD), physical vapor deposition (PVD), or atomic layer deposition (ALD), may be used to deposit the electrically insulating liner 110.

With continued reference to FIG. 6, the diffusion barrier 112 may be deposited on top of the electrically insulating liner 110 with uniform, or near uniform, thickness. The first intermetallic compound 118 may have a non-uniform thickness and can mechanically join the alloying material 114 with the copper material 116. Formation of the first intermetallic compound 118 may consume all or some of the alloying material 114. In one embodiment, the alloying material 114 is not entirely consumed by the formation of the first intermetallic compound 118 such that some of the alloying material 114 remains between the first intermetallic compound 118 and the diffusion barrier 112, as shown in FIG. 6. The mechanical bond created by the first intermetallic compound 118 and extremely close contact between the diffusion barrier 112 and the alloying material 114 can minimize the pistoning effect described above. The integrity of chip interconnects can be greatly improved by minimizing the pistoning effect because of the reduced risk of interconnect failure due to thermal expansion and contraction.

Referring to FIGS. 7A-7E, multiple steps of a method of forming a copper interconnect structure are shown. Now referring to FIG. 7A, a cross-sectional view of an interconnect structure 200 having an opening 206 in a nonmetallic material 202. The interconnect structure 200 may include lines or wires. In one embodiment, the nonmetallic material 202 may be made from any of several known semiconductor materials such as, for example, a bulk silicon substrate. Non-limiting examples include silicon, germanium, silicon-germanium alloy, silicon carbide, silicon-germanium carbide alloy, and compound (e.g. III-V and II-VI) semiconductor materials. In one embodiment, the nonmetallic material 202 may be made from a dielectric material know to a person having ordinary skill in the art. An optional electrically insulating liner (not shown) may be deposited along a sidewall 209 and on top of the nonmetallic material 202 within the opening 206.

Figure 7A:
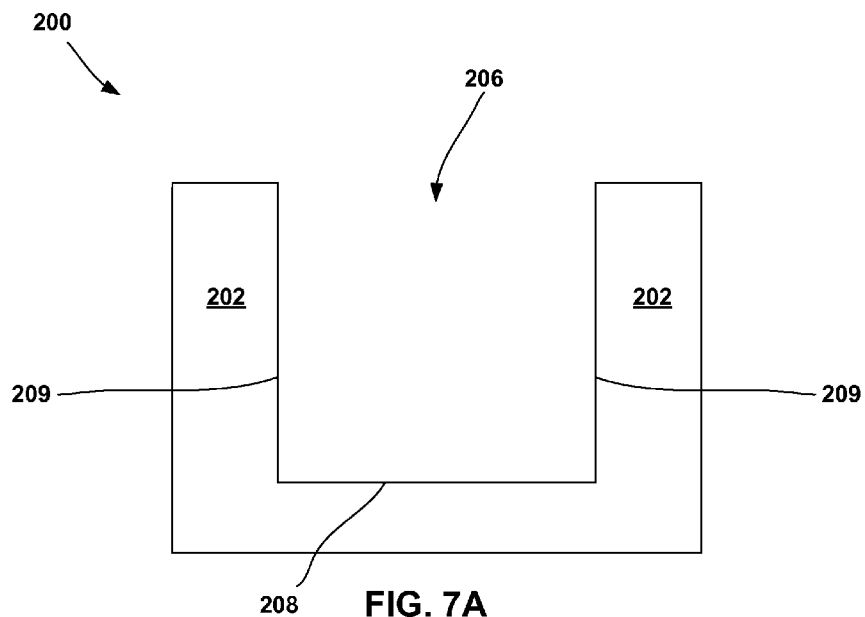
FIG. 7A-7E illustrate the steps of a method of forming a copper interconnect structure according to one embodiment.
Figure 7B:
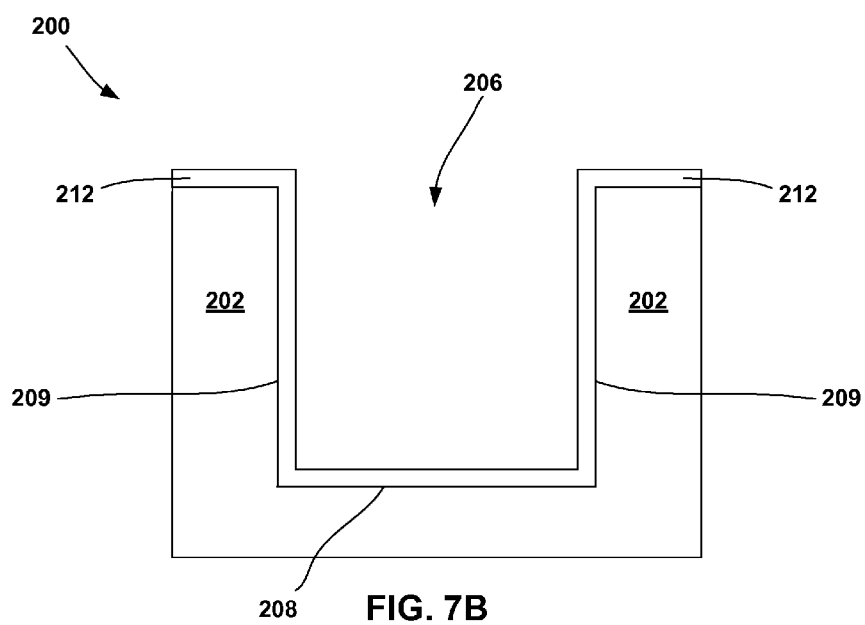

Now referring to FIG. 7B, a diffusion barrier 212 may be deposited along the sidewall 209 and on top of the nonmetallic material 202. The diffusion barrier 212 may be deposited along the sidewall 209 and a bottom 208 of the opening 206. The diffusion barrier 212 may include any material that which prohibits contamination of a copper material by the nonmetallic material 202. In one embodiment, the diffusion barrier 212 may be made from a material including tantalum nitride deposited by physical vapor deposition (PVD). In one embodiment, the diffusion barrier 212 may be deposited by an alternative deposition technique, for example chemical vapor deposition (CVD) or atomic layer deposition (ALD).

Figure 7C:
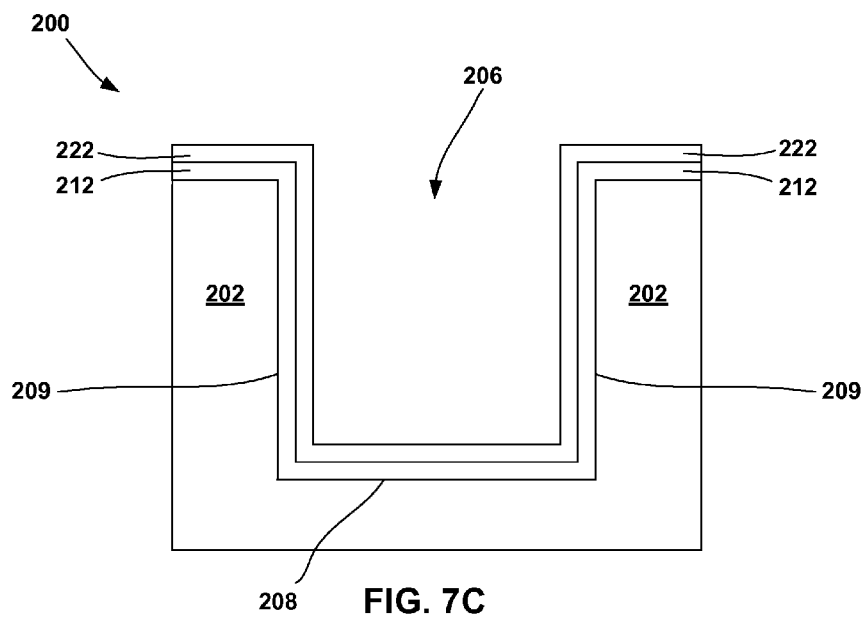

Now referring to FIG. 7C, a seed layer 222 may be deposited on top of the diffusion barrier 212 and along the sidewall 209 and the bottom 208 of the opening 206. In one embodiment, the seed layer 222 may be made form a material including copper or any other element capable of seeding copper, i.e. having the correct crystalline structure to seed copper. In other words, the crystal face orientation of the seed layer 222 will mimic the crystal face orientation of copper; such that the surface of the seed layer 222 will allow copper to grow from the its face. In one embodiment, the seed layer 222 may be made from a material including copper and deposited by PVD. In one embodiment, the seed layer 222 may be deposited by CVD or ALD.

Figure 7D:
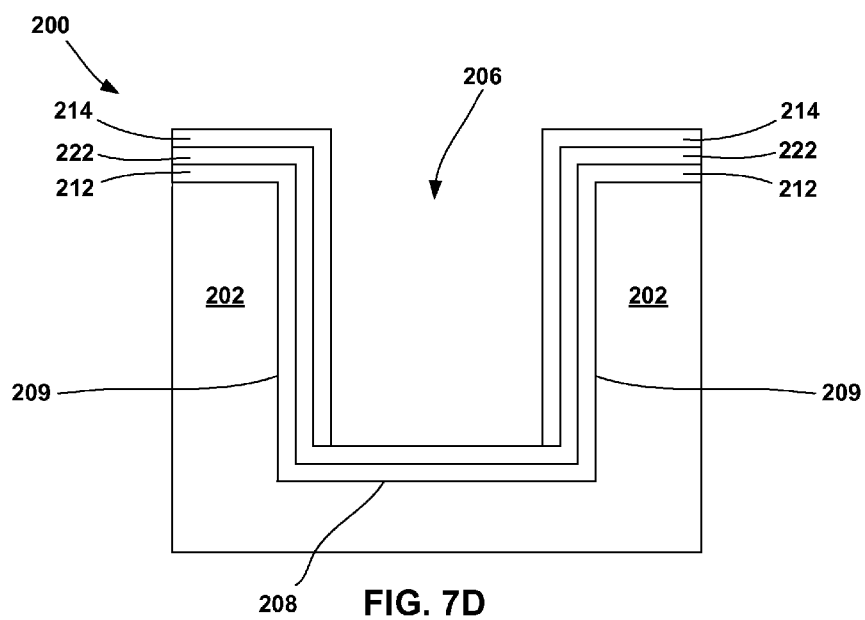
Figure 14:
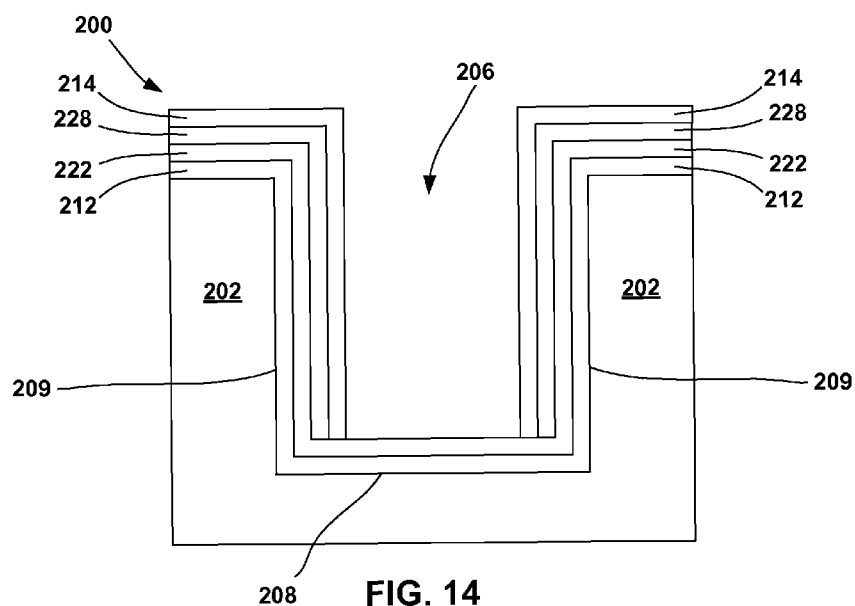
FIG. 14 illustrates a copper interconnect structure according to one embodiment.

Now referring to FIG. 7D, an alloying material 214 may be deposited on top of the seed layer 222, but only along the sidewall 209 of the opening 206. In one embodiment, the alloying material 214 may be deposited along the sidewall 209 and the bottom 208 of the opening 206. In such embodiments the alloying material 214 may be subsequently removed from the bottom 208 only by using an anisotropic etch technique selective to the seed layer 222. In one embodiment, the alloying material 214 may be made from a material including chromium deposited in a vacuum using a sputter deposition technique. In one embodiment, the alloying material 214 may be made from a material including chromium, copper, nickel, tin, magnesium, cobalt, aluminum, manganese, titanium, zirconium, indium, palladium, gold or some combination thereof. The alloying material 214 may not have the correct crystalline structure to serve as a seed for copper plating. In one embodiment, an optional adhesive liner 228 such as gold (see FIG. 14) may be used prior to depositing the alloying material 214. The thickness of the alloying material 214 may be between 50 to about 300 angstroms.

Figure 7E:
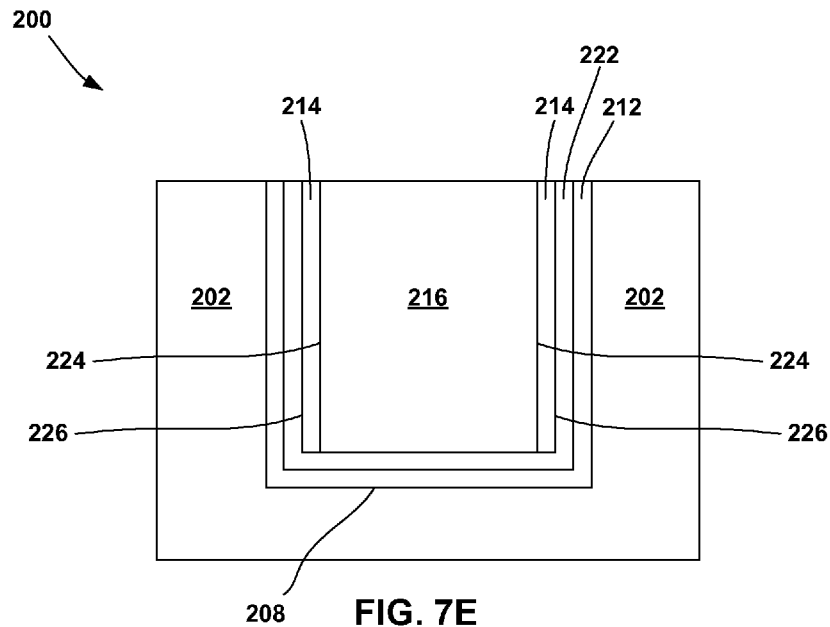

Now referring to FIG. 7E, a copper material 216 may be deposited on the seed layer 222 and within the opening 206 (shown in FIG. 7D) using an electroplating technique. The seed layer 222 may serve as a cathode to which an electrical potential is applied during an electroplating technique. Specifically, a negative voltage is applied to the seed layer 222. Because the specific alloying material 214 chosen may not have the correct crystalline structure to serve as a seed for copper plating, a bottom-up plating technique, free of voiding or pinch-off, may therefore be achieved. The bottom-up plating technique results in filling the opening 206 (shown in FIG. 7D) with the copper material 216. After the electroplating technique a chemical mechanical polishing (CMP) technique may be used to remove excess copper from the surface of the substrate. The CMP technique can remove the diffusion barrier 212, the seed layer 222, the alloying material 214, and excess copper material 216 selective to the top surface of the nonmetallic material 202.

The alloying material 214 may be used to form a mechanical bond between the copper material 216 and the sidewall 209 of the opening 206. The mechanical bond can be created either by forming an intermetallic compound or by creating a high friction interface caused by extremely close contact between layers. Extremely close contact may be defined as maximizing interfacial surface contact while minimizing foreign contaminants between two layers. The mechanical bond may be created at an intersection 224 and an intersection 226. Lack of a mechanical bond between the copper material 216 and the sidewall 209 of the opening 206 may result in a pistoning effect where the copper material 216 moves vertically within the opening 206 during thermal cycling due to copper's relatively high coefficient of thermal expansion in comparison to surrounding semiconductor materials (e.g. silicon, silicon oxides, and silicon nitrides). Thermal expansion and contraction is inevitable when building or operating integrated circuits. Pistoning of the copper material 216 may impose stress and strain on corresponding components that may be connected to the copper material 216 and over time will cause a failure in these connections.

Referring to FIGS. 8-12, multiple different embodiments of the interconnect structure 200 are shown. Now referring to FIG. 8, one embodiment of the interconnect structure 200 is shown. A first interaction may occur between the alloying material 214 (shown in FIG. 7E) and the copper material 216 at the intersection 224 (shown in FIG. 7E). The first interaction may produce a first intermetallic compound 218 formed from the alloying material 214 (shown in FIG. 7E) and the copper material 216 at the intersection 224 (shown in FIG. 7E). The first intermetallic compound 218 may include the alloying material 214 (shown in FIG. 7E) and the copper material 216. The first intermetallic compound 218 can form a mechanical bond between the alloying material 214 (shown in FIG. 7E) and the copper material 216. The first intermetallic compound 218 may be formed either simultaneously while plating the copper material 216 or any time thereafter, for example during a subsequent annealing process.

Formation of the intermetallic compound 218 between the alloying material 214 (shown in FIG. 7E) and the copper material 216 may occur when favorable thermodynamic and kinetic conditions exist for the compounds to form as a precipitate within a solid solution of the two materials, in this case the alloying material 214 (shown in FIG. 7E) and the copper material 216. Intermetallic compounds may be stoichiometric or non-stoichiometric. For example, $Ag_3Sn$ is an intermetallic compound that may form when Ag and Sn are in a solid solution.

A second interaction may occur between the diffusion barrier 212 and the seed layer 222 at the intersection 226. The second interaction may involve extremely close contact between the seed layer 222 and the alloying material 214 (shown in FIG. 7E) at the intersection 226 (shown in FIG. 7E). Extremely close contact may create an area of high friction which may result in a mechanical bond between the seed layer 222 and the alloying material 214 (shown in FIG. 7E). Extremely close contact may be achieved by depositing one material on top of another material in a vacuum using a sputter deposition technique. If one material is deposited on another material with either vacuum interruption or via an aqueous system, the possibility for extremely close contact is significantly diminished by native oxides or third body interference films, e.g. water may be present between the interfaces. The seed layer 222 may be deposited on top of the diffusion barrier 112 in a vacuum using the sputter deposition technique, and resulting in an extremely close physical interface.

Figure 8:
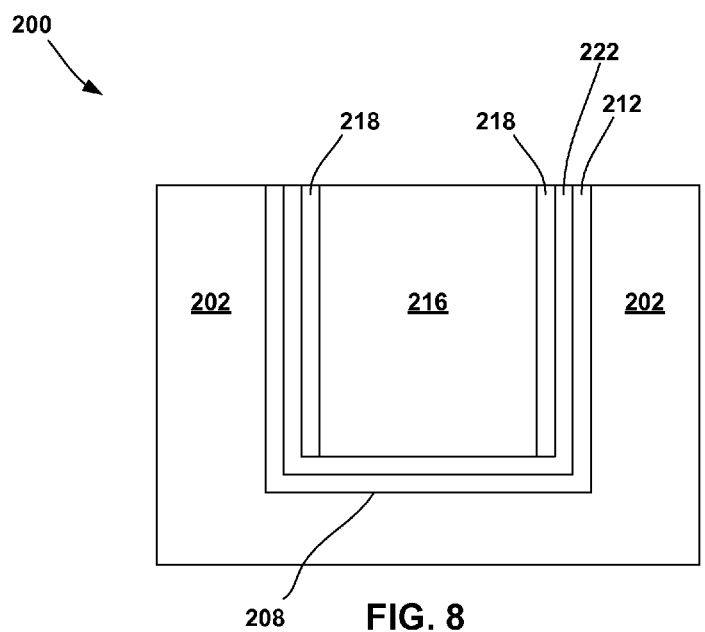
FIG. 8 illustrates a copper interconnect structure according to one embodiment.

With continued reference to FIG. 8, the diffusion barrier 212 may be deposited with uniform, or near uniform, thickness. The seed layer 222 may be deposited with uniform, or near uniform, thickness. The first intermetallic compound 218 may have a non-uniform thickness and can mechanically join the alloying material 214 (shown in FIG. 7E) with the copper material 216. Formation of the first intermetallic compound 218 may consume all or some of the alloying material 214 (shown in FIG. 7E). In one embodiment, the alloying material 214 (shown in FIG. 7E) is entirely consumed by the formation of the first intermetallic compound 218, as shown in FIG. 8. The mechanical bond created by the first intermetallic compound 218 and extremely close contact between the seed layer 222 and the alloying material 214 (shown in FIG. 7E) can minimize the pistoning effect described above. The integrity of chip interconnects can be greatly improved by minimizing the pistoning effect because of the reduced risk of interconnect failure due to thermal expansion and contraction.

Figure 9:
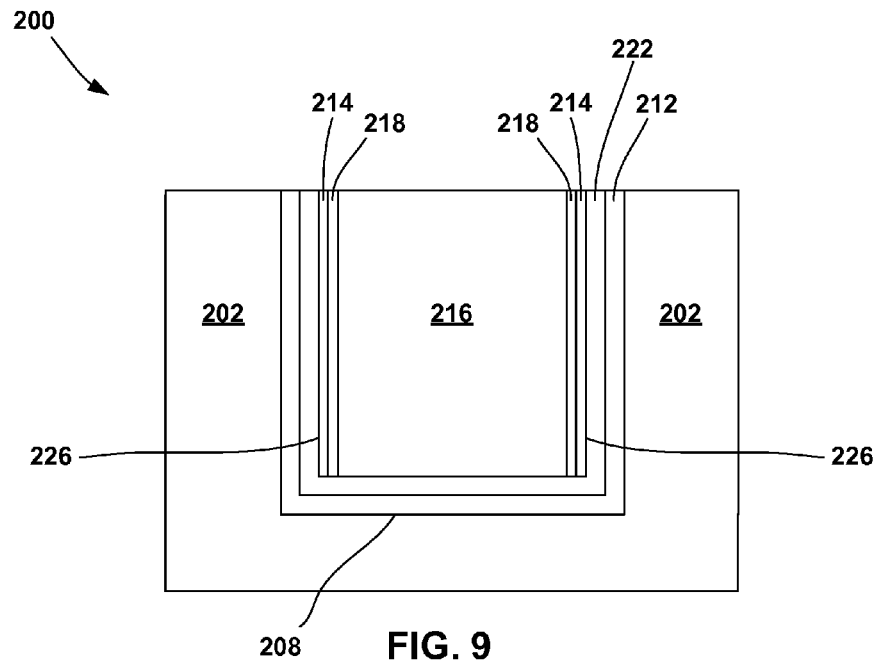
FIG. 9 illustrates a copper interconnect structure according to one embodiment.

Now referring to FIG. 9, one embodiment of the interconnect structure 200 is shown. A first interaction may occur between the alloying material 214 and the copper material 216 at the intersection 224 (shown in FIG. 7E). The first interaction may produce a first intermetallic compound 218 formed from the alloying material 214 and the copper material 216 at the intersection 224 (shown in FIG. 7E). The first intermetallic compound 218 may include the alloying material 214 and the copper material 216. The first intermetallic compound 218 can form a mechanical bond between the alloying material 214 and the copper material 216. The first intermetallic compound 218 may be formed either simultaneously while plating the copper material 216 or any time thereafter, for example during a subsequent annealing process.

A second interaction may occur between the seed layer 222 and the alloying material 214 at the intersection 226. The second interaction may involve extremely close contact between the seed layer 222 and the alloying material 214 at the intersection 226. Extremely close contact may create an area of high friction which may result in a mechanical bond between the seed layer 222 and the alloying material 214.

With continued reference to FIG. 9, the diffusion barrier 212 may be deposited with uniform, or near uniform, thickness. The seed layer 222 may be deposited with uniform, or near uniform, thickness. The first intermetallic compound 218 may have a non-uniform thickness and can mechanically join the alloying material 214 with the copper material 216. Formation of the first intermetallic compound 218 may consume all or some of the alloying material 214. In one embodiment, the alloying material 214 is not entirely consumed by the formation of the first intermetallic compound 218 such that some of the alloying material 214 remains between the first intermetallic compound 218 and the seed layer 222, as shown in FIG. 9. The mechanical bond created by the first intermetallic compound 218 and extremely close contact between the seed layer 222 and the alloying material 214 can minimize the pistoning effect described above. The integrity of chip interconnects can be greatly improved by minimizing the pistoning effect because of the reduced risk of interconnect failure due to thermal expansion and contraction.

Figure 10:
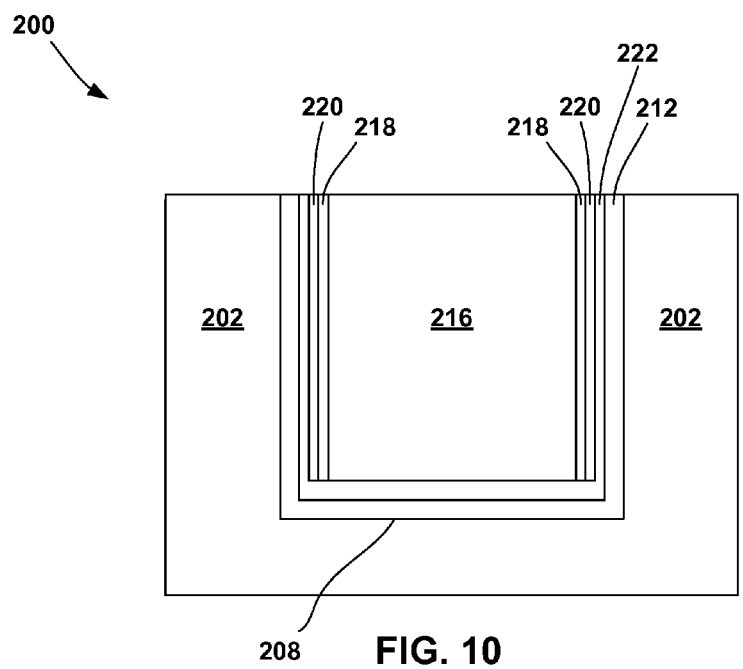
FIG. 10 illustrates a copper interconnect structure according to one embodiment.

Now referring to FIG. 10, one embodiment of the interconnect structure 200 is shown. A first interaction may occur between the alloying material 214 (shown in FIG. 7E) and the copper material 216 at the intersection 224 (shown in FIG. 7E). The first interaction may produce a first intermetallic compound 218 formed from the alloying material 214 (shown in FIG. 7E) and the copper material 216 at the intersection 224 (shown in FIG. 7E). The first intermetallic compound 218 may include the alloying material 214 (shown in FIG. 7E) and the copper material 216. The first intermetallic compound 218 can form a mechanical bond between the alloying material 214 (shown in FIG. 7E) and the copper material 216. The first intermetallic compound 218 may be formed either simultaneously while plating the copper material 216 or any time thereafter, for example during a subsequent annealing process.

A second interaction may occur between the seed layer 222 and the alloying material 214 (shown in FIG. 7E) at the intersection 226 (shown in FIG. 7E). The second interaction may produce a second intermetallic compound 220 formed from the seed layer 222 and the alloying material 214 (shown in FIG. 7E) at the intersection 226 (shown in FIG. 7E). The second intermetallic compound 220 may include the seed layer 222 and the alloying material 214 (shown in FIG. 7E). The second intermetallic compound 220 can form a mechanical bond between the seed layer 222 and the alloying material 214 (shown in FIG. 7E). The second intermetallic compound 220 may be formed either simultaneously while depositing the alloying material 214 (shown in FIG. 7E) or any time thereafter, for example during a subsequent annealing process.

With continued reference to FIG. 10 the diffusion barrier 212 may be deposited with uniform, or near uniform, thickness. The seed layer 222 may be deposited with uniform, or near uniform, thickness. The first intermetallic compound 218 may have a non-uniform thickness and can mechanically join the alloying material 214 (shown in FIG. 7E) with the copper material 216. The second intermetallic compound 220 may have a non-uniform thickness and can mechanically join the seed layer 222 with the alloying material 214 (shown in FIG. 7E). Formation of the intermetallic compounds 218, 220 may consume all or some of the alloying material 214 (shown in FIG. 7E). In one embodiment, the alloying material 214 (shown in FIG. 7E) is entirely consumed by the formation of the intermetallic compounds 218, 220, as shown in FIG. 10. The mechanical bond created by the intermetallic compounds 218, 220 can minimize the pistoning effect described above. The integrity of chip interconnects can be greatly improved by minimizing the pistoning effect because of the reduced risk of interconnect failure due to thermal expansion and contraction.

Figure 11:
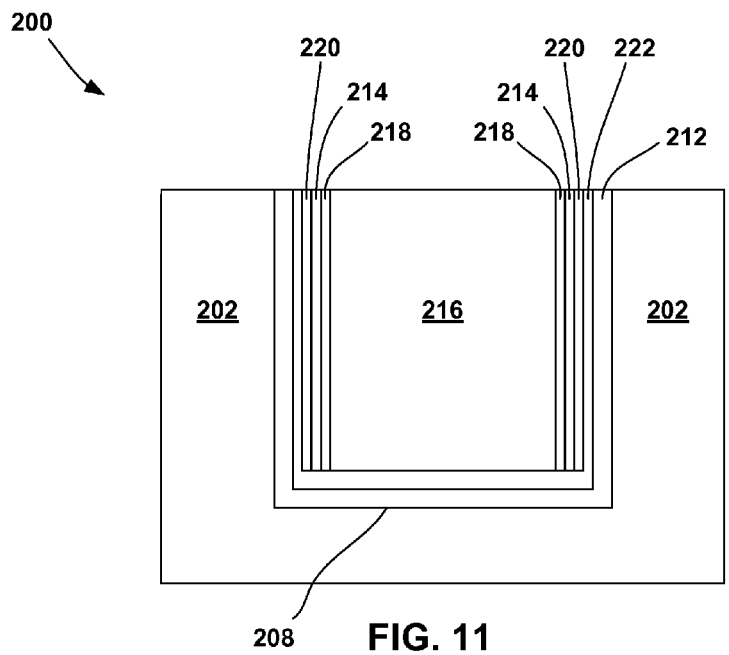
FIG. 11 illustrates a copper interconnect structure according to one embodiment.

Now referring to FIG. 11, one embodiment of the interconnect structure 200 is shown. A first interaction may occur between the alloying material 214 and the copper material 216 at the intersection 224 (shown in FIG. 7E). The first interaction may produce a first intermetallic compound 218 formed from the alloying material 214 and the copper material 216 at the intersection 224 (shown in FIG. 7E). The first intermetallic compound 218 may include the alloying material 214 and the copper material 216. The first intermetallic compound 218 can form a mechanical bond between the alloying material 214 and the copper material 216. The first intermetallic compound 218 may be formed either simultaneously while plating the copper material 216 or any time thereafter, for example during a subsequent annealing process.

A second interaction may occur between the seed layer 222 and the alloying material 214 at the intersection 226 (shown in FIG. 7E). The second interaction may produce the second intermetallic compound 220 formed from the seed layer 222 and the alloying material 214 at the intersection 226 (shown in FIG. 7E). The second intermetallic compound 220 may include the seed layer 222 and the alloying material 214. The second intermetallic compound 220 can form a mechanical bond between the seed layer 222 and the alloying material 214. The second intermetallic compound 220 may be formed either simultaneously while depositing the alloying material 114 or any time thereafter, for example during a subsequent annealing process.

With continued reference to FIG. 11, the diffusion barrier 212 may be deposited with uniform, or near uniform, thickness. The seed layer 222 may be deposited with uniform, or near uniform, thickness. The first intermetallic compound 218 may have a non-uniform thickness and can mechanically join the alloying material 214 with the copper material 216. The second intermetallic compound 220 may have a non-uniform thickness and can mechanically join the seed layer 222 with the alloying material 214. Formation of the intermetallic compounds 218, 220 may consume all or some of the alloying material 214. In one embodiment, the alloying material 214 is not entirely consumed by the formation of the intermetallic compounds 218, 220 such that some of the alloying material 214 remains between the first intermetallic compound 218 and the second intermetallic compound 220 as shown in FIG. 11. The mechanical bond created by the intermetallic compounds 218, 220 can minimize the pistoning effect described above. The integrity of chip interconnects can be greatly improved by minimizing the pistoning effect because of the reduced risk of interconnect failure due to thermal expansion and contraction.

Figure 12:
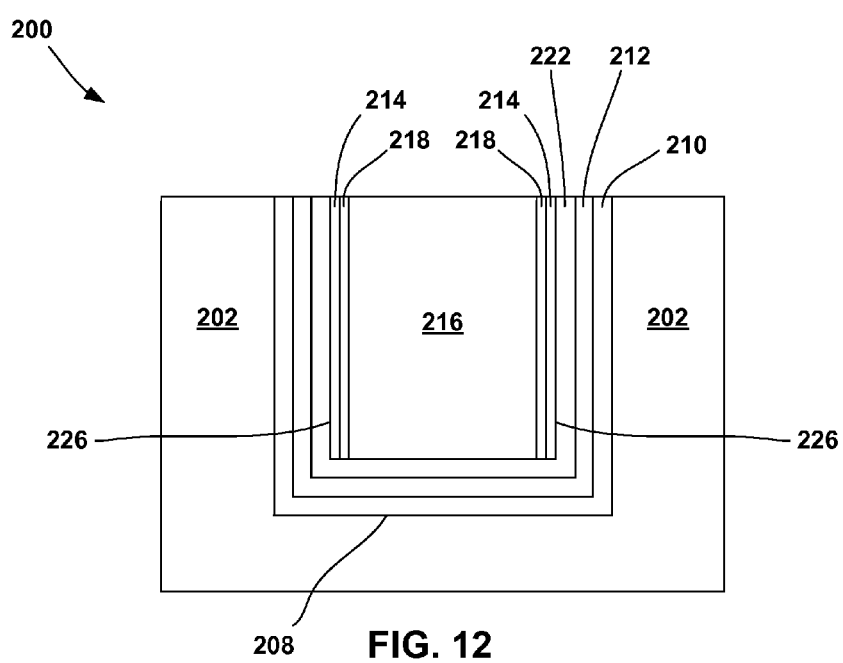
FIG. 12 illustrates a copper interconnect structure according to one embodiment.

Now referring to FIG. 12, one embodiment of the interconnect structure 200 is shown. A first interaction may occur between the alloying material 214 and the copper material 216 at the intersection 224 (shown in FIG. 7E). The first interaction may produce a first intermetallic compound 218 formed from the alloying material 214 and the copper material 216 at the intersection 224 (shown in FIG. 7E). The first intermetallic compound 218 may include the alloying material 214 and the copper material 216. The first intermetallic compound 218 can form a mechanical bond between the alloying material 214 and the copper material 116. The first intermetallic compound 218 may be formed either simultaneously while plating the copper material 216 or any time thereafter, for example during a subsequent annealing process.

A second interaction may occur between the seed layer 222 and the alloying material 214 at the intersection 226. The second interaction may involve extremely close contact between the seed layer 222 and the alloying material 214 at the intersection 226. Extremely close contact may create an area of high friction which may result in a mechanical bond between the seed layer 222 and the alloying material 214.

The optional electrically insulating liner 210 may be deposited on top of the nonmetallic material 202 prior to depositing the diffusion barrier 212. The electrically insulating liner 210 may include any material that which prohibits the conduction of electricity between a copper material and a semi-conductive nonmetallic material. Therefore, if the nonmetallic material 202 is itself electrically insulating, the electrically insulating liner 210 may not be used. The electrically insulating liner 210 may be made from an oxide, nitride, or insulating polymer. Deposition techniques such as, for example, chemical vapor deposition (CVD), physical vapor deposition (PVD), or atomic layer deposition (ALD), may be used to deposit the electrically insulating liner 210.

With continued reference to FIG. 12, the diffusion barrier 212 may be deposited on top of the electrically insulating liner 210 with uniform, or near uniform, thickness. The first intermetallic compound 218 may have a non-uniform thickness and can mechanically join the alloying material 214 with the copper material 216. Formation of the first intermetallic compound 218 may consume all or some of the alloying material 214. In one embodiment, the alloying material 214 is not entirely consumed by the formation of the first intermetallic compound 218 such that some alloying material 214 remains between the first intermetallic compound 218 and the seed layer 222, as shown in FIG. 12. The mechanical bond created by the first intermetallic compound 218 and extremely close contact between the seed layer 222 and the alloying material 214 can minimize the pistoning effect described above. The integrity of chip interconnects can be greatly improved by minimizing the pistoning effect because of the reduced risk of interconnect failure due to thermal expansion and contraction.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A structure formed in an opening, the opening having a sidewall defined by a non-metallic material and having a bottom defined by the non-metallic material, the structure comprising a diffusion barrier covering the sidewall and bottom, and a fill composed of a conductive material, the structure comprising:
    a seed layer located directly on top of and conformal to the diffusion barrier, wherein the seed layer is parallel to the sidewall and bottom of the opening, the seed layer comprises a crystalline structure suitable for plating copper;
    a first intermetallic compound and an alloy layer parallel to the sidewall of the opening and separating the seed layer from the conductive material, the diffusion barrier is in direct contact with the seed layer, the seed layer is in direct contact with the alloy layer, the alloy layer is in direct contact with the first intermetallic compound, and the first intermetallic compound is in direct contact with the conductive material, the first intermetallic compound is a precipitate within a solid solution of an alloying material of the alloy layer and the conductive material, and is molecularly bound to both the alloy layer and the conductive material, the alloying material excludes the conductive material and comprises at least one of the materials selected from the group consisting of chromium, tin, nickel, magnesium, cobalt, aluminum, manganese, titanium, zirconium, indium, palladium, silver, and combinations thereof; and
    a boundary between the seed layer and the alloy layer extending in a direction parallel to the sidewall of the opening, the boundary comprises extremely close contact between the seed layer and the alloy layer such that a high friction interface is created.

2. The structure of claim 1, wherein the alloying material is chromium.

3. The structure of claim 1, wherein the conductive material is selected from the group consisting of copper, aluminum, and tungsten.

4. The structure of claim 1, further comprising:
    an electrically insulating liner located between the nonmetallic material and the diffusion barrier, and parallel to the bottom and sidewall of the opening.

5. The structure of claim 1, further comprising:
    a second intermetallic compound located between the seed layer and the first intermetallic compound, and parallel to the sidewall of the opening, the second intermetallic compound is a precipitate within a solid solution of a seed layer material from the seed layer and the alloying material and is molecularly bound to both the seed layer and the first intermetallic compound the boundary, and as such the high friction interface, between the seed layer and the alloy layer no longer exist.

6. The structure of claim 5, further comprising:
    an alloy layer located between the first intermetallic compound and the second intermetallic compound, and parallel to the sidewall of the opening, wherein the alloy layer comprises only the alloying material and is molecularly bound to both the first intermetallic compound and the second intermetallic compound.

7. A structure formed in an opening, the opening having a sidewall defined by a non-metallic material and having a bottom defined by the non-metallic material, the structure comprising a diffusion barrier covering the sidewall and bottom, and a fill composed of a conductive material, the structure comprising:
    a seed layer located directly on top of and conformal to the diffusion barrier, wherein the seed layer is parallel to the sidewall and bottom of the opening, the seed layer comprises a crystalline structure suitable for plating copper;
    a first intermetallic compound and a second intermetallic compound parallel to the sidewall of the opening and separating the seed layer from the conductive material, the diffusion barrier is in direct contact with the seed layer, the seed layer is in direct contact with the second intermetallic compound, the second intermetallic compound is in direct contact with the first intermetallic compound, and the first intermetallic compound is in direct contact with the conductive material, the first intermetallic compound is a precipitate within a solid solution of an alloying material and the conductive material, and is molecularly bound to both the second intermetallic compound and the conductive material, the second intermetallic compound is a precipitate within a solid solution of a seed layer material of the seed layer and the alloying material, and is molecularly bound to both the seed layer and the first intermetallic compound, the alloying material excludes the conductive material and comprises at least one of the materials selected from the group consisting of chromium, tin, nickel, magnesium, cobalt, aluminum, manganese, titanium, zirconium, indium, palladium, silver, and combinations thereof.

8. The structure of claim 7, wherein the alloying material is chromium.

9. The structure of claim 7, wherein the conductive material is selected from the group consisting of copper, aluminum, and tungsten.

10. The structure of claim 7, further comprising:
an electrically insulating liner located between the nonmetallic material and the diffusion barrier, and parallel to the bottom and sidewall of the opening.

11. A structure formed in an opening, the opening having a sidewall defined by a non-metallic material and having a bottom defined by the non-metallic material, the structure comprising a diffusion barrier covering the sidewall and bottom, and a fill composed of a conductive material, the structure comprising:
a seed layer located directly on top of and conformal to the diffusion barrier, wherein the seed layer is parallel to the sidewall and bottom of the opening, the seed layer comprises a crystalline structure suitable for plating copper;
a first intermetallic compound, an alloy layer, and a second intermetallic compound parallel to the sidewall of the opening and separating the seed layer from the conductive material, the diffusion barrier is in direct contact with the seed layer, the seed layer is in direct contact with the second intermetallic compound, the second intermetallic compound is in direct contact with the alloy layer, the alloy layer is in direct contact with the first intermetallic compound, and the first intermetallic compound is in direct contact with the conductive material, the first intermetallic compound is a precipitate within a solid solution of an alloying material of the alloy layer and the conductive material, and is molecularly bound to both the alloy layer and the conductive material, the second intermetallic compound is a precipitate within a solid solution of a seed layer material of the seed layer and the alloying material of the alloy layer, and is molecularly bound to both the seed layer and the alloy layer, the alloying material excludes the conductive material and comprises at least one of the materials selected from the group consisting of chromium, tin, nickel, magnesium, cobalt, aluminum, manganese, titanium, zirconium, indium, palladium, silver, and combinations thereof.

12. The structure of claim 11, wherein the alloying material is chromium.

13. The structure of claim 11, wherein the conductive material is selected from the group consisting of copper, aluminum, and tungsten.

14. The structure of claim 11, further comprising:
an electrically insulating liner located between the nonmetallic material and the diffusion barrier, and parallel to the bottom and sidewall of the opening.

* * * * *